United States Patent [19]

Kimata

[11] Patent Number: 4,581,539
[45] Date of Patent: Apr. 8, 1986

[54] SOLID-STATE IMAGE SENSOR
[75] Inventor: Masafumi Kimata, Itami, Japan
[73] Assignee: Mitsubishi Denki Kabushiki Kaisha, Tokyo, Japan
[21] Appl. No.: 519,904
[22] Filed: Aug. 3, 1983
[30] Foreign Application Priority Data Aug. 13, 1982 [JP] Japan .................. 57-141431

[51] Int. Cl.[4] .......................................... H01J 40/14
[52] U.S. Cl. ..................................... 250/578; 358/213
[58] Field of Search .................. 250/211 J, 578, 209; 358/212, 213; 357/24 LR, 30, 31, 32

[56] References Cited

U.S. PATENT DOCUMENTS 4,179,711 12/1979 Nagumo .............................. 358/213
4,447,735 5/1984 Horii .................................. 250/578
4,504,848 3/1985 Matsumoto et al. ........... 357/24 LR

OTHER PUBLICATIONS

M. Kimata et al, "Platinum Silicide Schottky-Barrier IR-CCD Image Sensors", Journal of Applied Physics, vol. 21 (1982), Supplement 21-1, pp. 231-235.
S. Terakawa et al, "A New Organization Area Image Sensor with CCD Readout through Charge Priming Transfer", IEEE Electron Device Letters, vol. EDL-1, No. 5, May 1980, pp. 86-88.

Primary Examiner—David C. Nelms
Attorney, Agent, or Firm—Lowe, Price, LeBlanc, Becker & Shur

[57] ABSTRACT

A solid-state image sensor comprises photo sensors (111 to 114, 211 to 214 and 311 to 314), transfer gates (121 to 124, 221 to 224 and 321 to 324), a selecting circuit (800), vertical charge transferring elements (130, 230 and 330) and a driving circuit (900) for applying clock signals to the vertical charge transferring elements. When the vertical charge transferring elements receive signal charge from the photo sensors, the vertical charge transferring elements constitute respectively a continuous potential well, and then transfer of the signal charge in the vertical charge transferring elements is performed by controlling the clock signals applied to the vertical charge transferring elements so as to move a potential barrier successively toward the moving direction of the charge.

12 Claims, 10 Drawing Figures

SOLID-STATE IMAGE SENSOR

BACKGROUND OF THE INVENTION

1. Field of the Invention

The present invention relates to a solid-state image sensor, and particularly relates to a two-dimensional solid-state image sensor being characterized in the reading of signals.

2. Description of the Prior Art

Generally, a solid-state image sensor comprises photo sensors and a scanning circuit on a semiconductor material such as silicon, and if suitable photo sensors are selected, images from the visible region to an infrared region can be provided. As compared with a conventional image tube, a solid-state image sensor is advantageous in that it is compact, light in weight and has high reliability and in particular, few portions need to be adjusted in manufacturing a camera using such an image sensor. Thus, such a solid-state image sensor has attracted attention in various fields recently.

As a scanning circuit of a solid-state image sensor, a MOS switch system or a CCD (charge coupled device) system is conventionally used in most cases. In the former MOS switch system, spike noise due to the MOS switches used for reading the signals is mixed into the signals, which decreases the signal-to-noise ratio. In addition, the spike noise differs between the columns for reading the signals, which generates a so called fixed pattern noise to further decrease the signal-to-noise ratio, and as a result, a MOS switch system cannot be used for the detection of an extremely low light level application which requires a high signal-to-noise ratio. On the other hand, in the latter CCD system, particularly in a CCD interline system which has been widely used recently because it is capable of freely selecting photo sensors as in a MOS system, CCDs are disposed between the respective columns of photo sensors, and in order to enlarge the effective area of the photo sensors, it is desired to minimize the area of the CCD portion in making a design. In addition, the charge transferring capacity of the CCDs is proportional to the storage gate area for one stage of CCDs if the CCDs have the same structure. Accordingly, if the area of the CCD portion is decreased, the maximum value of the charge to be handled become limited. Such a problem becomes serious particularly at the time of detecting a low level signal in a high level background as in an infrared ray solid-state image sensor. Therefore, a solid-state image sensor making less noise and having a large amount of charge to be handled has been desired.

SUMMARY OF THE INVENTION

Briefly, the present invention is a solid-state image sensor which comprises a plurality of photodetecting means arranged in two dimensions, a plurality of transfer gate means respectively connected to the photodetecting means, a plurality of vertical charge transferring means connected to each column of transfer gate means, horizontal charge transferring means connected to the vertical charge transferring means, selecting means connected to the transfer gate means and driving means connected to the vertical charge transferring means, each of the vertical charge transferring means including a plurality of gate electrodes.

The photodetecting means detect light to generate signal charge. The transfer gate means control the transfer of the signal charge from each photodetecting means. The vertical charge transferring means transfer the signal charge inputted from the transfer gate means. The horizontal charge transferring means transfers the signal charge from the vertical charge transferring means to the output portion. The selecting means provides clock signals successively to each group of transfer gate means which corresponds to each row of transfer gate means, so as to select one group of transfer gate means successively, so that signal charge is outputted from the selected one group of transfer gate means. The driving means applies, to the vertical charge transferring means before one group out of the groups of transfer gate means is selected, gate potential for forming potential wells under all the gate electrodes included in the vertical charge transferring means and scans the gate potential so as to extinguish the potential wells under the gate electrodes included in the vertical charge transferring means successively from the well under the gate electrode at the farthest end with respect to the horizontal charge transferring means, whereby the signal charge is transferred from the vertical charge transferring means to the horizontal charge transferring means. In accordance with the present invention, when the vertical charge transferring means receive signal charge from the photodetecting means, the vertical charge transferring means constitute respectively a continuous potential well, and then, the signal charge is transferred in the vertical charge transferring means by controlling the clock signals applied to the vertical charge transferring means so as to move the potential barrier successively toward the moving direction of the charge.

Therefore, a principal object of the present invention is to provide a solid-state image sensor making less noise and having a large amount of charge to be handled.

Principal advantages of the present invention are that spike noise as in a MOS system is never produced since transfer of the signal charge is performed through the potential well in the same manner as in a conventional CCD system and that the signal charge amount to be handled can be made extremely large since it is determined by the potential well of a whole vertical line of vertical charge transferring means.

Another advantage of the present invention is that the signal charge amount to be handled can be made sufficiently large in the vertical charge transferring means even if the width of channels for forming a vertical signal lines is made small.

Still a further advantage of the present invention is that it is easy to enlarge the sizes of the horizontal charge transferring means according to the necessary amount of charge since the transfer gate means and the horizontal charge transferring means can be formed outside the arrays of the photodetecting means and less limitation is made to the sizes.

These objects and other objects, features aspects and advantages of the present invention will become more apparent from the following detailed description of the present invention when taken in conjunction with the accompanying drawings.

DESCRIPTION OF THE PREFERRED EMBODIMENTS

Figure 1:
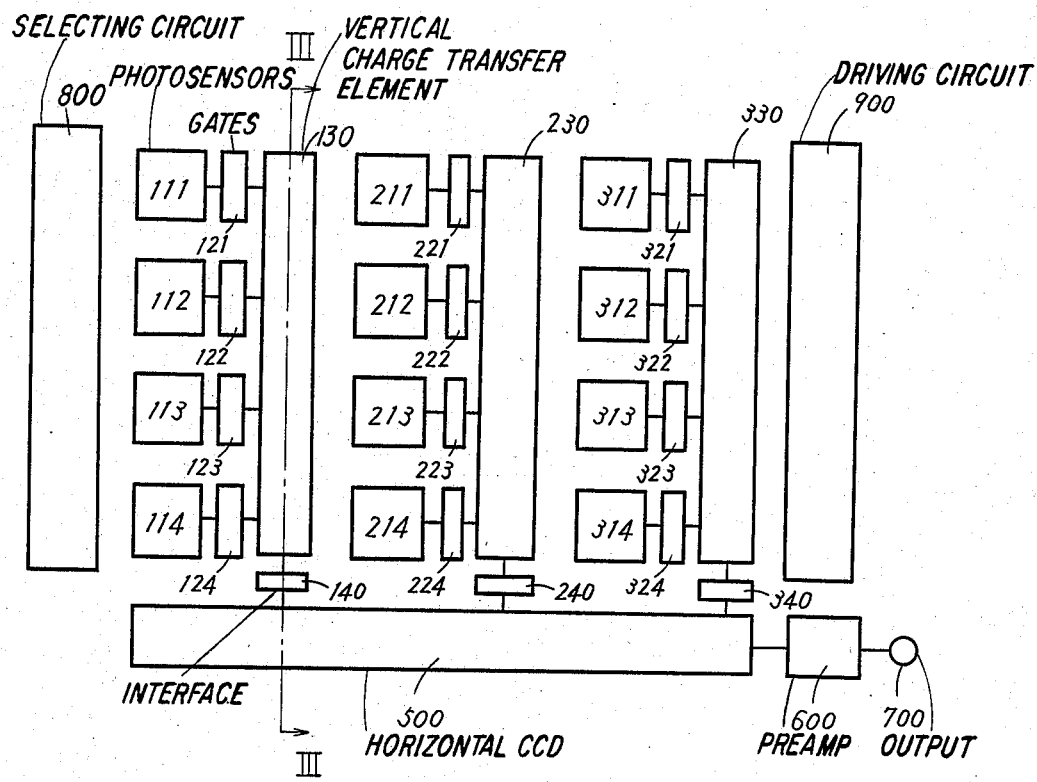
FIG. 1 is a block diagram showing an embodiment of the present invention.

FIG. 1 is a block diagram showing an embodiment of the present invention. In this embodiment, an array of 3 columns×4 rows is represented for the purpose of facilitating the explanation. A solid-state image sensor in accordance with this embodiment comprises photo sensors 11 to 114, 211 to 214 and 311 to 314 disposed two-dimensionally on a semiconductor substrate, transfer gates 121 to 124, 221 to 224 and 321 to 324 formed of MOS transistors on the semiconductor substrate, vertical charge transferring elements 130, 230 and 330 formed on the semiconductor substrate, interface portions 140, 240 and 340 formed on the semiconductor substrate, which constitute an interface with a horizontal CCD 500, an output preamplifier 600, an output portion 700 and a selecting circuit 800 for selecting transfer gates. Though not shown in the drawing, the selecting circuit 800 is connected so that the same signal may be applied to the groups of transfer gates arranged in the horizontal direction (for example, the group of transfer gates 121, 221 and 321). The solid-state image sensor further comprises a driving circuit 900 for applying driving clock signals, as described later, to the vertical charge transferring elements 130, 230 and 330.

Figure 2A:
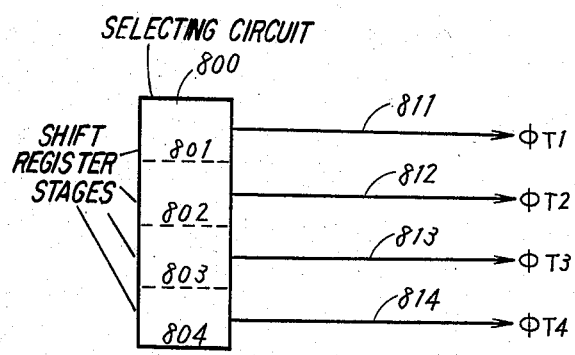
FIG. 2A is a block diagram showing a selecting circuit.
Figure 2B:
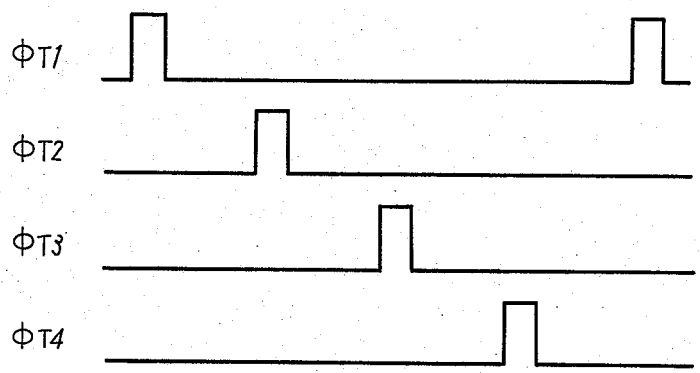
FIG. 2B and 2C show the timing of clock signals outputted from the selecting circuit.
Figure 2C:
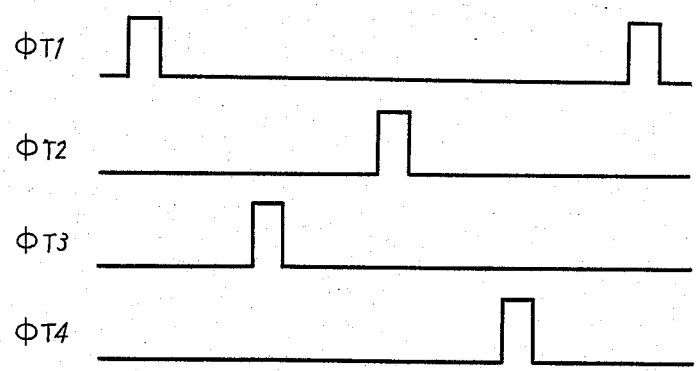

Now, operation of a solid-state image sensor having the above described structure will be described in the following. FIG. 2A is a block diagram showing a selecting circuit 800. FIGS. 2B and 2C show the timing of clock signals outputted from the selecting circuit 800. In a 3× 4 array as shown in FIG. 1, the selecting circuit 800 is composed of four blocks 801 to 804 as shown in FIG. 2A, the outputs of the blocks being connected respectively to the lines 811 to 814 going toward the transfer gates. The lines 811 to 814 are connected respectively to the groups of transfer gates (121, 221 and 321) to (124, 224 and 324). Clock signals $\phi_{T1}$ to $\phi_{T4}$ from the blocks 801 to 804 are outputted so that the timing as shown in FIG. 2A may be attained. In this case, n-channel transfer gates are used, and when clock signals are at the level "H", the transfer gates turn on. In the timing in FIG. 2B, interlaced scanning is not performed. In order to perform 2:1 interlaced scanning, the timing as shown in FIG. 2C will be needed. The timing of the clock signals $\phi_{T1}$ to $\phi_{T4}$ is not limited to the timing in FIGS. 2B and 2C; the timing may be determined otherwise so that the clock signals $\phi_{T1}$ to $\phi_{T4}$ attain the level "H" at different moments. In order that clock signals as shown in FIG. 2B may be outputted, the selecting circuit 800 can be composed of ordinary shift registers. In such a case, the blocks 801 to 804 constitute stages for the shift registers so that the output in the previous stage becomes the input in the subsequent state. For the purpose of facilitating the explanation, it is assumed that the selecting circuit 800 operates with the timing as shown in FIG. 2B.

Figures 3A, 3B:
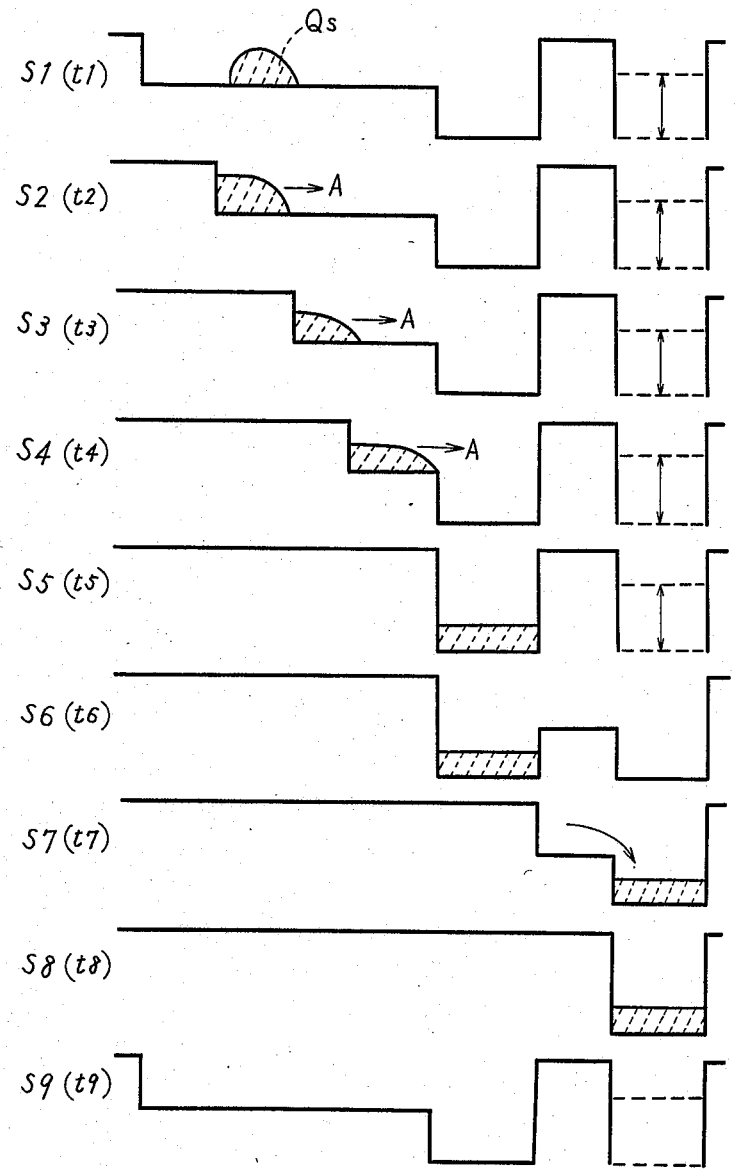
FIG. 3A is a sectional view taken along the line III—III in FIG. 1.
FIG. 3B shows potential states in the portions shown in FIG. 3A.
Figure 4:
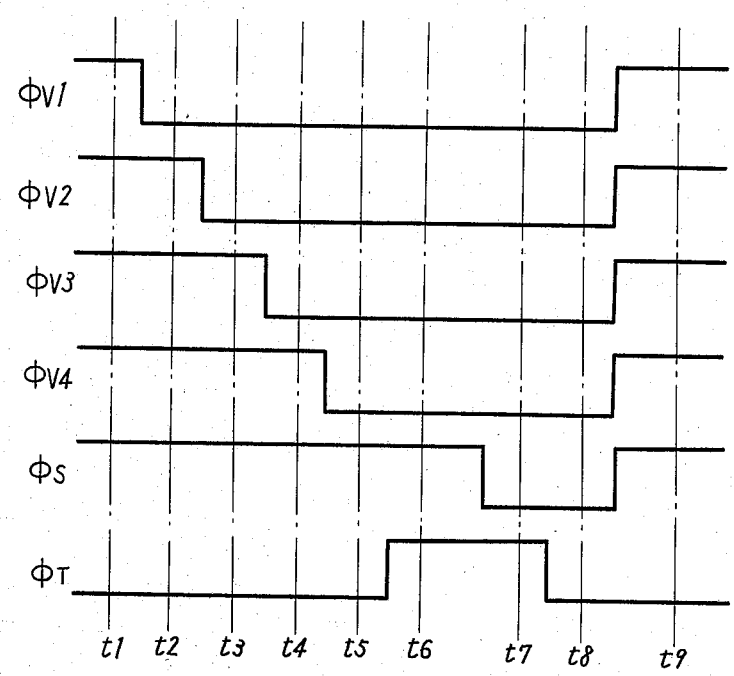
FIG. 4 is a timing chart of clock signals applied to the portions shown in FIG. 3A.

First, when the clock signal $\phi_{T1}$ attains the level "H", the transfer gates 121, 221 and 321 turn on to apply the signal charge from the photo sensors 111, 211 and 311 to the vertical charge transferring elements 130, 230 and 330. Then, the driving circuit 900 operates to start the transfer of the signal charge, which will be explained in the following with reference to FIGS. 3A, 3B and 4. FIG. 3A is a sectional view taken along the line III—III in FIG. 1; FIG. 3B shows the potential states in the portions shown in FIG. 3A; FIG. 4 is a timing chart of clock signals applied to the portions shown in FIG. 3A. The vertical charge transferring element 130 comprises four gate electrodes 131 to 134 and the interface portion 140 comprises two gate electrodes 141 and 142, the end of the interface portion 140 being in contact with a gate electrode 501 in the horizontal CCD 500. The reference numeral 10 denotes a semiconductor substrate. Channels are formed under the respective gate electrodes. These channels may be surface channels or buried channels. FIG. 3A shows a structure in which gaps are provided between the respective electrodes. However, multilayer gate electrodes may be used with overlapped portions between the electrodes. To the gate electrodes 131 to 134, 141 and 142, clock signals $\phi_{V1}$ to $\phi_{V4}$, $\phi_S$ and $\phi_T$ as shown in FIG. 4 are applied respectively. In this case, n-channels are adopted. In the case of p-channels, the polarity of the clock signals will have to be inverted.

Among the above described clock signals, at least clock signals $\phi_{V1}$ to $\phi_{V4}$ are produced in the driving circuit 900. In a suitable manner, clock signals $\phi_S$ and $\phi_T$ can also be produced in the driving circuit 900, but they may be provided from outside. In case where clock signals $\phi_{V1}$ to $\phi_{V4}$ are produced in the driving circuit 900, the driving circuit 900 may be composed of well known delay circuits or shift registers. Each column of vertical charge transferring elements 130, 230 and 330 has the same structure; the vertical charge transferring elements 230 and 330 have exactly the same structure as that of the vertical charge transferring element 130. Also, each column of interface portions 140, 240 and 340 has the same structure; the interface portions 240 and 340 have exactly the same structure as that of the interface portion 140. In addition, the same signal is applied to the horizontally arranged gate electrodes of the vertical charge transferring elements 130, 230 and 330, in the same manner as in the case of the transfer gates and exactly the same operation is performed in each column. Similarly, the same signal is applied to the horizontally arranged gate electrodes of the interface portions 140, 240 and 340, and exactly the same operation is performed in each column. In the following, operation will be described only with regard to the first column represented by a section taken along the line III—III in FIG. 1.

Vertical charge transfer in the portions shown in FIG. 3A will be described referring to FIG. 3B. The potential states S1 to S9 in FIG. 3B correspond respectively to the timings t1 to t9 in FIG. 4. For example, the state S1 is a potential state in the portions shown in FIG. 3A when it corresponds to the timing t1. At this time, the clock signals $\phi_{V1}$ to $\phi_{V4}$ are all at the level "H" and as a result a large potential well is formed under the gate electrodes 131 to 134, and a deeper potential well is formed under the gate electrode 141 since the clock signal $\phi_S$ is at the level "H" higher than the clock signals $\phi_{V1}$ to $\phi_{V4}$, and a shallow potential barrier is formed under the gate electrode 142 since the clock signal $\phi_T$ is at the level "L". On the other hand, the horizontal CCD 500 performs charge transfer in the above described state and changes in potential state in a reciprocating manner between the limits as shown by the dotted lines in FIG. 3B. In such a state, when an arbitrary transfer gate in the vertical direction, for example a transfer gate 121 is turned on to read the content of the photo sensor 111 into the vertical charge transferring element 130, a signal charge $Q_S$ is given to the potential well under the gate electrodes 131 to 134. Then, in the timing t2, when the clock signal $\phi_{V1}$ becomes to be at the level "L", the signal charge $Q_S$ is pushed toward the direction of an arrow A in FIG. 3, since the potential well under the gate electrode 131 becomes shallow as shown in the state S2. Further, in the timings t3 to t5, the clock signals $\phi_{V2}$ to $\phi_{V4}$ are successively brought to the level "L", the potential wells under the gate electrodes 132 to 134 become shallow successively as shown in the states S3 to S5, so that the signal charge $Q_S$ is pushed toward the direction of the arrow A. At the time when the clock signal $\phi_{V4}$ is at the level "L", the signal charge $Q_S$ is stored in the potential well under the gate electrode 141. The gate electrode 141 must be sufficiently large for storing the signal charge $Q_S$, but the potential well under the gate electrode 141 at the time when the clock signal $\phi_S$ is at the level "H" need not be deeper than the potential well under the gate electrodes 131 to 134 as shown in the above described embodiment. Thus, the signal charge $Q_S$ is collected in the gate electrode 141 and after scanning for one horizontal line in the horizontal CCD 500 is completed, the clock signal $\phi_H$ of the gate electrode 501 of the horizontal CCD 500 in contact with the gate electrode 142 is brought to the level "H" and the clock signal $\phi_T$ of the gate electrode 142 is brought to the level "H" in the timing t6. Then, the potentials under the respective gate electrodes become to be in the state S6 shown in FIG. 3B. At this time, the potential well under the gate electrode 142 is made shallower than the potential well under the gate electrodes 141 and 501, but it is not necessarily needed to determine the potentials in such a manner. Next, in the timing t7, the clock signal $\phi_S$ is at the level "L" and the potential well under the gate electrode 141 becomes shallow as shown in the state S7, so that the signal charge $Q_S$ moves into the potential well under the gate electrode 501. After that, in the timing t8, clock signal $\phi_T$ is brought to the level "L" and the potential well under the gate electrode 142 becomes shallow as shown in the state S8, so that the signal charge $Q_S$ is transferred to the horizontal CCD 500. The horizontal CCD 500 which has received the signal charge $Q_S$ operates to transfer signals successively to the output preamplifier 600. After a signal is transferred to the horizontal CCD 500, the clock signals $\phi_{V1}$ to $\phi_{V4}$ and $\phi_S$ attain again the level "H" in the timing t9 and the same state as in the timing t1 is established.

Next, when the clock signal $\phi_{T2}$ reaches the level "H", the transfer gate 122 is turned on to apply the signal of the photo sensor 112 to the vertical charge transferring element 130, so that the signal is transferred to the horizontal CCD 500 in the same operation as described above. Further, the same cycle is repeated so as to read the signals of the photo sensors 113 and 114, and thus one frame is brought to an end.

The above described operation is performed simultaneously in the other columns. Thus, scanning of a two-dimensional array is performed.

As described in the foregoing, in accordance with the present invention, since signal charge is transferred through the potential well in the same manner as in a conventional CCD system, spike noise as in a MOS system is never produced and the signal charge amount to be handled can be made extremely large since it is determined by the potential well in a whole vertical line of the vertical charge transferring elements 130, 230 and 330. In addition, even if the width of channels for forming a vertical signal line is made small in the vertical charge transferring elements, the signal charge amount to be handled can be made sufficiently large. Furthermore, since the interface portions 140, 240 and 340 and the horizontal CCD 500 can be formed outside the array of the photo sensors 111 to 114, 211 to 214 and 311 to 314, less limitation is made to the sizes thereof and it becomes easy to enlarge the interface portions and the horizontal CCD according to the necessary charge amount. In the above described embodiment, the vertical charge transferring elements are scanned in one horizontal period (conventionally, vertical charge transferring elements are scanned in a period nearly equivalent to the time of one frame at the maximum) and the time required for the signal charge $Q_S$ to exist in the channel is shortened, and as a result, channel leak current and the smear phenomenon can be mitigated.

Figure 6:
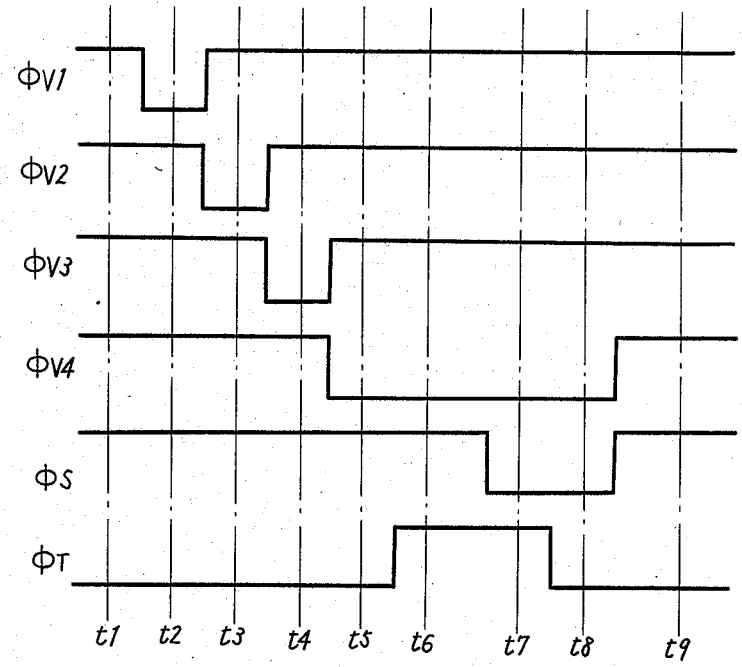
FIG. 6 is a timing chart of clock signals applied to the portions shown in FIG. 5A.
Figure 5A:
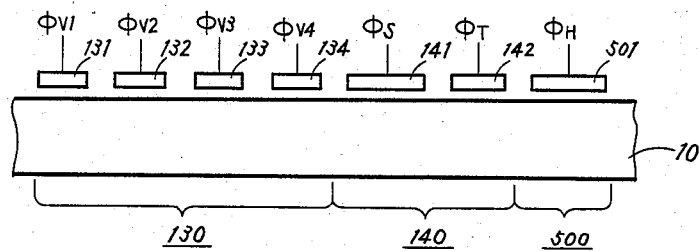
FIG. 5A is a sectional view taken along the line III—III in FIG. 1.
Figure 5B:
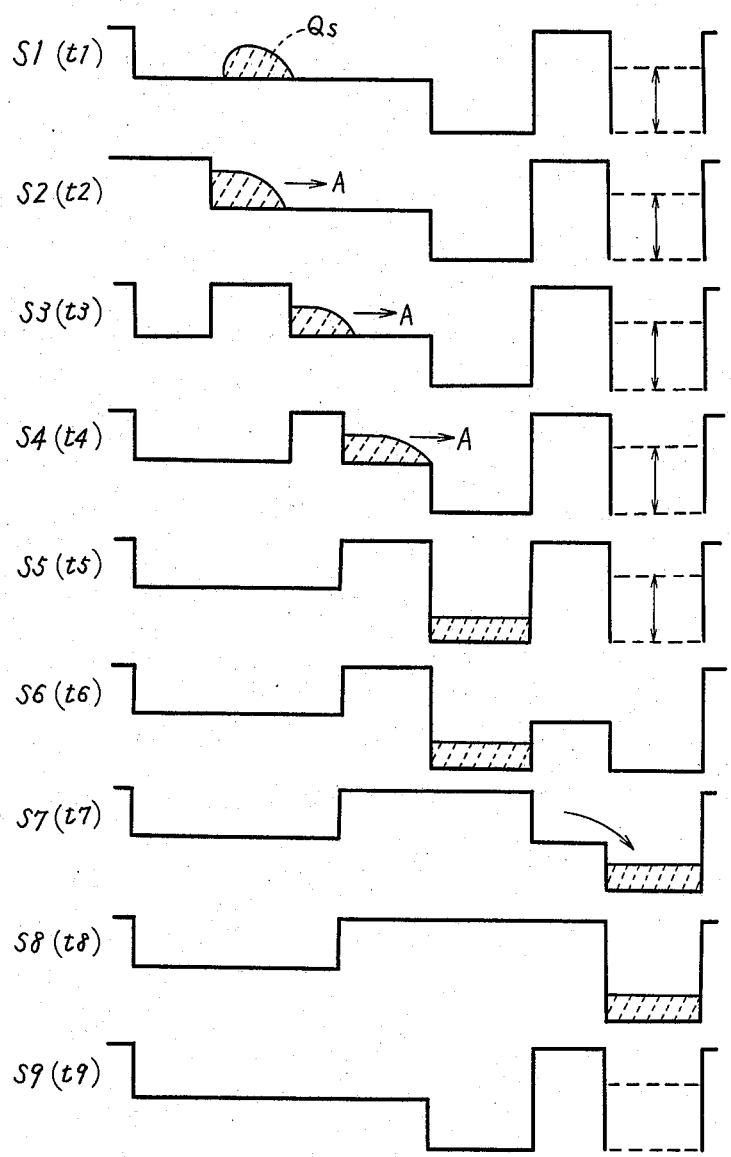
FIG. 5B shows other potential states in the portions shown in FIG. 5A.

Now, another embodiment of the present invention will be described. FIG. 5A is a sectional view taken along the line III—III in FIG. 1; FIG. 5B shows other potential states in the portions shown in FIG. 5A; FIG. 6 is a timing chart of clock signals applied to the portions shown in FIG. 5A. These figures correspond respectively to FIGS. 3A, 3B and 4 described above, and only the different points will be explained. The states S1 and S2 in FIG. 5B are identical to the states in the above described embodiment. In the state S3, after the clock signal $\phi_{V2}$ is brought to the level "L", the clock signal $\phi_{V1}$ becomes again to be at the level "H" so that a potential well is formed under the gate electrode 131. In the state S4, after the clock signal $\phi_{V3}$ is brought to the level "L", the clock signal $\phi_{V2}$ attains the level "H" so that potential wells are formed under the gate electrodes 131 and 132. Thus, in the state where the potential of one gate electrode is always at the level "L", the signal charge $Q_S$ is transferred successively till the state S5 in FIG. 5B is attained. In the states S7 to S9, the signal charge is transferred from the vertical charge transferring elements to the horizontal CCD, exactly in the same manner as in the above described embodiment.

Also in the above described second embodiment, the same effects as in the first embodiment can be obtained. In brief, the great feature of the present invention resides in that the vertical charge transferring elements constitute respectively a continuous potential well at the time of receiving the signal charge from the photo sensors and after that, the signal charge is transferred in the vertical charge transferring elements by controlling the clock signals of the vertical charge transferring elements so as to move the potential barrier toward the moving direction of the charge. Accordingly, although in the second embodiment, transfer of the signal charge in the vertical charge transferring elements is performed in the state where only one gate electrode is at the level "L", the same operation will be performed if more than one are at the level "L" as far as the potential barrier is made to move toward the moving direction of the signal charge.

In the above described two embodiments, description was made on the assumption that a vertical charge transferring element comprises four gate electrodes 131 to 134. However, the gate electrodes may be of any number as far as they are more than one. In addition, it is not needed to make the number of gate electrodes equal to the number of photo sensors in the vertical direction.

Although an interface portion comprises two gate electrodes in the above described embodiments, such structure is not necessarily required as far as the interface portion has the function of storing the charge and the function of transferring the charge to the horizontal CCD.

In the above described examples, all the channels are buried n-channels. However, there is no problem if p-channels or surface channels are used. In addition, transfer gates may be common gates used for the vertical charge transferring elements.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid-state image sensor comprising:
   a plurality of photodetecting means (111 to 114, 211 to 214 and 311 to 314) two-dimensionally arranged in rows and in columns for detecting light to output signal charge ($Q_S$),
   a plurality of transfer gate means (121 to 124, 221 to 224 and 321 to 324) for controlling transfer fo the signal charge from each photodetecting means, said plurality of transfer gate means being arranged two-dimensionally in rows and in columns and connected respectively to said photodetecting means,
   a plurality of vertical charge transferring means (130, 230 and 330) connected respectively to the columns of said transfer gate means for transferring said signal charge inputted from said transfer gate means, each of said vertical charge transferring means including a plurality of gate electrodes (131 to 134),
   horizontal charge transferring means (500) connected to said plurality of vertical charge transferring means for transferring said signal charge from said vertical charge transferring means,
   selecting means (800) connected to said transfer gate means for providing clock signals ($\phi_1$ to $\phi_4$) successively to each group of transfer gate means which corresponds to each row of said transfer gate means so as to select successively one group of transfer gate means in order that said signal charge is outputted from one selected group of transfer gate means, and
   driving means (900) connected to said vertical charge transferring means by which gate potential for forming a potential well under all the gate electrodes included in said vertical charge transferring means is applied to said vertical charge transferring means before one group out of said groups of transfer gate means is selected, and said gate potential is scanned so as to extinguish said potential wells under said gate electrodes included in said vertical charge transferring means successively, beginning with the well under the gate electrode farthest from said horizontal charge transferring means, before the next group of said transfer gate means is selected, so that the signal charge is transferred from said vertical charge transferring means to said horizontal charge transferring means.

2. A solid-state image sensor in accordance with claim 1, wherein said horizontal charge transferring means (500) is connected to said vertical charge transferring means through interface means (140, 240 and 340) which perform interface.

3. A solid-state image sensor in accordance with claim 1, wherein said transfer gate means (121 to 124, 221 to 224 and 321 to 324) comprise MOS transistors.

4. A solid-state image sensor in accordance with claim 1, wherein said selecting means (800) comprises shift registers.

5. A solid-state image sensor in accordance with claim 1, wherein said driving means (900) comprises shift registers.

6. A solid-state image sensor in accordance with claim 1, wherein said gate electrodes (131 to 134) are formed on a semiconductor substrate (10) and channels are formed under said gate electrodes.

7. A solid-state image sensor in accordance with claim 6, wherein said channels are n-channels.

8. A solid-state image sensor in accordance with claim 6, wherein said channels are p-channels.

9. A solid-state image sensor in accordance with claim 6, wherein said channels are buried channels.

10. A solid-state image sensor in accordance with claim 6, wherein said channels are surface channels.

11. A solid-state image sensor in accordance with claim 1 wherein said driving means is operable for concluding a single scan between successive selections of groups of said transferred gate means.

12. A solid-state image sensor in accordance with claim 11 wherein said driving means is operable for establishing each of said potential wells simultaneously, whereby all wells are simultaneously present.

* * * * *